US010191090B2

(12) United States Patent
Blake et al.

(10) Patent No.: US 10,191,090 B2
(45) Date of Patent: Jan. 29, 2019

(54) POWER TRANSFORMERS USING OPTICAL CURRENT SENSORS

(71) Applicants: ALSTOM TECHNOLOGY LTD, Baden (CH); James Blake, Baden (CH); Alan Baker, Baden (CH); Joseph Schaeffer, Baden (CH); Michael Putt, Baden (CH)

(72) Inventors: James Blake, Paradise Valley, AZ (US); Alan Baker, N. Palm Beach Gardens, FL (US); Joseph H. Schaeffer, Palm Beach Gardens, FL (US); Michael Putt, Palm City, FL (US)

(73) Assignee: ALSTOM TECHNOLOGY LTD, Baden (CH)

( * ) Notice: Subject to any disclaimer, the term of this patent is extended or adjusted under 35 U.S.C. 154(b) by 189 days.

(21) Appl. No.: 15/035,386

(22) PCT Filed: Nov. 12, 2014

(86) PCT No.: PCT/US2014/065174
§ 371 (c)(1),
(2) Date: May 9, 2016

(87) PCT Pub. No.: WO2015/073510
PCT Pub. Date: May 21, 2015

(65) Prior Publication Data

US 2016/0291063 A1 Oct. 6, 2016

Related U.S. Application Data

(60) Provisional application No. 61/902,942, filed on Nov. 12, 2013.

(51) Int. Cl.

| | |
|---|---|
| ***G01R 31/04*** | (2006.01) |
| ***G01R 15/24*** | (2006.01) |
| ***G01R 31/02*** | (2006.01) |

(52) U.S. Cl.
CPC .......... *G01R 15/24* (2013.01); *G01R 31/027* (2013.01); *G01R 31/04* (2013.01); *G01R 15/246* (2013.01)

(58) Field of Classification Search
CPC ........ G01R 15/14; G01R 15/18; G01R 15/22; G01R 15/23; G01R 19/02; G01R 19/10;
(Continued)

(56) References Cited

U.S. PATENT DOCUMENTS 5,134,356 A * 7/1992 El-Sharkawi ......... H02J 3/1864 323/209
6,208,189 B1 3/2001 Freeman et al.
(Continued)

FOREIGN PATENT DOCUMENTS

EP 0004321 B1 10/1981
JP S63-302737 A 12/1988
(Continued)

OTHER PUBLICATIONS

A. Norouzi; "Open phase conditions in transformers analysis and protection algorithm"; 2013 66th Annual Conference for Protective Relay Engineers; IEEE; ProRelay 2013; XP032598352; Apr. 8, 2013; pp. 112-135.

(Continued)

*Primary Examiner* — Thang Le
(74) *Attorney, Agent, or Firm* — GE Global Patent Operation; Scott R. Stanley

(57) ABSTRACT

Systems and methods according to these exemplary embodiments provide for methods and systems related to optical current sensors used to monitor standby power transformers, specifically fiber optical current and voltage sensors and, more particularly, to applications involving filters for use in such sensors, such as frequency tracking comb filters. According to one embodiment, a method for monitoring a
(Continued)

connection condition of a stand by power transformer includes the steps of measuring a current flowing through a high voltage side of the standby power transformer using at least one optical current sensor disposed proximate to a current flow path of the high voltage side, using a comb filter to filter the measured current, determining whether the filtered, measured current is less than a predetermined threshold value; and generating an alarm indication that the high voltage side of the standby power transformer is unconnected.

23 Claims, 9 Drawing Sheets

(58) Field of Classification Search
CPC .. G01R 19/18; G01R 19/22; G01R 19/25145; G01R 19/165; G01R 19/175; G01R 31/02; G01R 31/08; G01R 31/027; G01R 31/12; G01R 31/15; G01R 31/20; G01R 31/25; G01R 31/1227; G01R 31/346
See application file for complete search history.

(56) References Cited

U.S. PATENT DOCUMENTS

2005/0237036 A1 10/2005 Nguyen et al.
2010/0131215 A1* 5/2010 Kim .................... G01R 31/025 702/58
2010/0295692 A1 11/2010 Bjorn
2011/0010106 A1* 1/2011 Katsukura ............. G01D 4/002 702/19
2011/0204875 A1 8/2011 Blake et al.
2012/0074792 A1 3/2012 Hodges et al.
2013/0285671 A1* 10/2013 Hoffman ............. G01R 31/027 324/547
2014/0022686 A1* 1/2014 Meisel .................... H01H 9/54 361/115
2014/0233662 A1* 8/2014 Hansell ................... H04B 3/54 375/258
2015/0360246 A1 12/2015 Iwase et al.

FOREIGN PATENT DOCUMENTS

| | | | |
|---|---|---|---|
| JP | H04-140013 | A | 5/1992 |
| JP | H05-056521 | A | 3/1993 |
| JP | 2005045859 | A | 2/2005 |
| JP | 2010-093897 | A | 4/2010 |
| JP | 5230041 | B1 | 7/2013 |
| WO | 2008137651 | A2 | 11/2008 |

OTHER PUBLICATIONS

M. A. Brojboiu, et al.; "Concerning the No Load High Voltage Transformers Disconnecting"; Proceedings 26th European Conference on Modelling and Stimulation (ECMS) 2012 Proceedings Edited by K.G. Troitzsch, et al.; XP055381192; May 29, 2012; pp. 198-202.
Extended European Search Report in corresponding European Application No. 14 86 2650 dated Jun. 27, 2017.
International Search Report in related International Application No. PCT/US2014/065174, dated Feb. 9, 2015.
Written Opinion of the International Searching Authority in related International Application No. PCT/US2014/065174, dated Feb. 9, 2015.
Notification of Reasons for Refusal issued in connection with corresponding JP Application No. 2016-530961 dated Aug. 28, 2018.

* cited by examiner

POWER TRANSFORMERS USING OPTICAL CURRENT SENSORS

RELATED APPLICATION

This application is related to, and claims priority from, U.S. Patent Application Ser. No. 61/902,942, filed on Nov. 12, 2013 entitled "Open-Phase Detection on Unloaded Power Transformers Using Optical CTs to detect the presence (or absence) of the Proper Magnetization Current", the disclosure of which is incorporated here by reference.

BACKGROUND

The present invention pertains to fiber optical current and voltage sensors and, more particularly, to applications involving filters for use in such sensors.

One important aspect of electrical power systems deployed by the power generation industry is the ability to measure power carried over high voltage transmission lines. Power measurement has typically been performed on the high voltage side of the systems before the voltage is stepped down for distribution. However, the need is growing for more frequent and more accurate power measurements (e.g., voltage and current measurements) throughout the power distribution systems. Some recent innovations associated with making such power measurements involve the use of fiber optic sensors as described in more detail in, for example, the above-incorporated by reference U.S. Patent Publication 2011/0204875.

There are a number of different electrical power systems which require such monitoring. For example, in nuclear power applications, standby power transformers are employed to run critical equipment in the case of a failure. Normally, these standby power transformers are unloaded, but the high side is connected. By keeping their high sides connected, standby power transformers can be quickly switched on when needed. However, there have been several incidents where these generators were not fully connected at the high side (i.e., they had an open-phase condition), and it was not known until the emergency power was needed. In response to this problem, the Nuclear Regulatory Commission in the United States is implementing a requirement that all such standby generators have monitoring equipment installed to detect the open phase condition.

If unloaded, the current flowing into the high side of such standby power transformers is substantially the current attributable to the magnetization current of the power transformer's core, e.g., typically on the order of less than one ampere such as 50 to 800 mA. Alternatively, if the standby power transformer is slightly loaded, e.g., due to the presence of a monitoring load, then the current flowing into the high side of the standby power transformer might be a bit higher, e.g., on the order of an ampere. Regardless, when in the undesirable open-phase condition, the current flowing into the high side of the standby power transformer will drop to approximately zero (there may still be some very small capacitive current).

Thus, in order to tell if a standby power transformer is properly connected or not, a monitoring system can be used to determine when the high side current flow drops below some predetermined threshold, e.g., 25 to 500 mA. In order to reliably measure such small currents, the current sensor must be able to resolve currents several times lower than the low-level threshold, or typically about 10 mA. This value may vary according to the specific transformer under consideration. One way to design an optical current sensor to be able to detect current levels as low as 10 mA is by using a combination of a large number of fiber sensing turns in combination with a number of wire wraps around the sensing fiber loops. For example, Alstom has fielded a product which employs 60 wraps of sensing fiber together with 10 wraps of the primary conductor, yielding a multiplication factor of the current of 600.

However, in some applications it is not practical to employ multiple wraps of the primary conductor around the fiber optic current sensor. Also, it is quite expensive to install a large number of sensing fiber turns (e.g., 600 fiber turns) in a single optical current sensor, which would be needed absent the multiplicative effect provided by the multiple wraps of the primary conductor around the fiber optic current sensor.

Another approach to providing an optical current sensor which can detect such low levels of current involves passing the output of the optical current sensor through a comb filter as, for example, described in U.S. patent application Ser. No. 12/598,651, entitled "Adaptive Filters for Fiber Optic Sensors, also referred to herein as U.S. Patent Publication 2011/0204875, the disclosure of which is incorporated here by reference. In U.S. Patent Publication No. 2011/0204875, the comb filter is triggered off the current waveform that itself is being filtered. The raw current passes through a narrow band pass filter around the largest frequency component to be measured (normally the fundamental frequency). The zero crossings of the waveform at the output of this filter are used to track the frequency of the signal, and thus to provide the reset function required in the comb signal processing.

The system described in U.S. Patent Publication No. 2011/0204875 is therefore limited in its ability to accurately track the frequency (and thus properly time the resets of the comb filter) when the signal-to-noise ratio becomes too low. At some low level of primary signal, the noise coming through the band pass filter substantially interferes with the zero crossings of the resultant signal, distorting their location, or even adding extraneous zero crossings. Thus the system described in U.S. Patent Publication No. 2011/0204875 suffers a limitation in its ability to recover a small signal from a large noise.

Accordingly, it would be desirable to provide optical current sensors, transformers, systems and sensing methods which address the foregoing issues.

SUMMARY

Systems and methods according to the present invention address this need and others by providing systems and methods related to fiber optical current sensors (sometimes also referred to as optical current transformer (OCTs)) which are used to measure current passing through a high side of a standby power transformer to determine whether the transformer is (properly) connected.

According to one embodiment, a method for monitoring a connection condition of a standby power transformer includes the steps of measuring a current flowing through a high voltage side of the standby power transformer using at least one optical current sensor disposed proximate to a current flow path of the high voltage side, using a comb filter to filter the measured current, determining whether the filtered, measured current is less than a predetermined threshold value; and generating an alarm indication that the high voltage side of the standby power transformer is unconnected when the filtered, measured current is determined to be less than the predetermined threshold value.

According to another embodiment, a system for monitoring a connection condition of a standby power transformer includes a standby power transformer, at least one optical current sensor configured to measure a current flowing through a high voltage side of the standby power transformer and disposed proximate to a current flow path of the high voltage side, a comb filter to filter the measured current, a processor configured to determine whether the filtered, measured current is less than a predetermined threshold value to generate an alarm indication that the high voltage side of the standby power transformer is unconnected when the filtered, measured current is determined to be less than the predetermined threshold value.

According to another embodiment, a method for monitoring a connection condition of a standby power transformer includes the steps of: measuring a current flowing through a high voltage side of the standby power transformer using at least one optical current sensor disposed proximate to a current flow path of the high voltage side, filtering the measured current using two different filtering techniques to generate a highly filtered measured current value and a lightly filtered measured current value, evaluating both the highly filtered measured current value and the lightly filtered current value to determine whether at least one condition is satisfied; and generating an alarm indication that the high voltage side of the standby power transformer is unconnected when the at least one condition is satisfied.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

In order to provide some context for this discussion, an exemplary fiber optic current sensor disclosed is illustrated as FIG. 1 and described below. However it will be appreciated that filtering devices and techniques according to these exemplary embodiments are not limited to use in this particular sensor configuration and may be used in other fiber optic current and voltage sensors.

Figure 1:
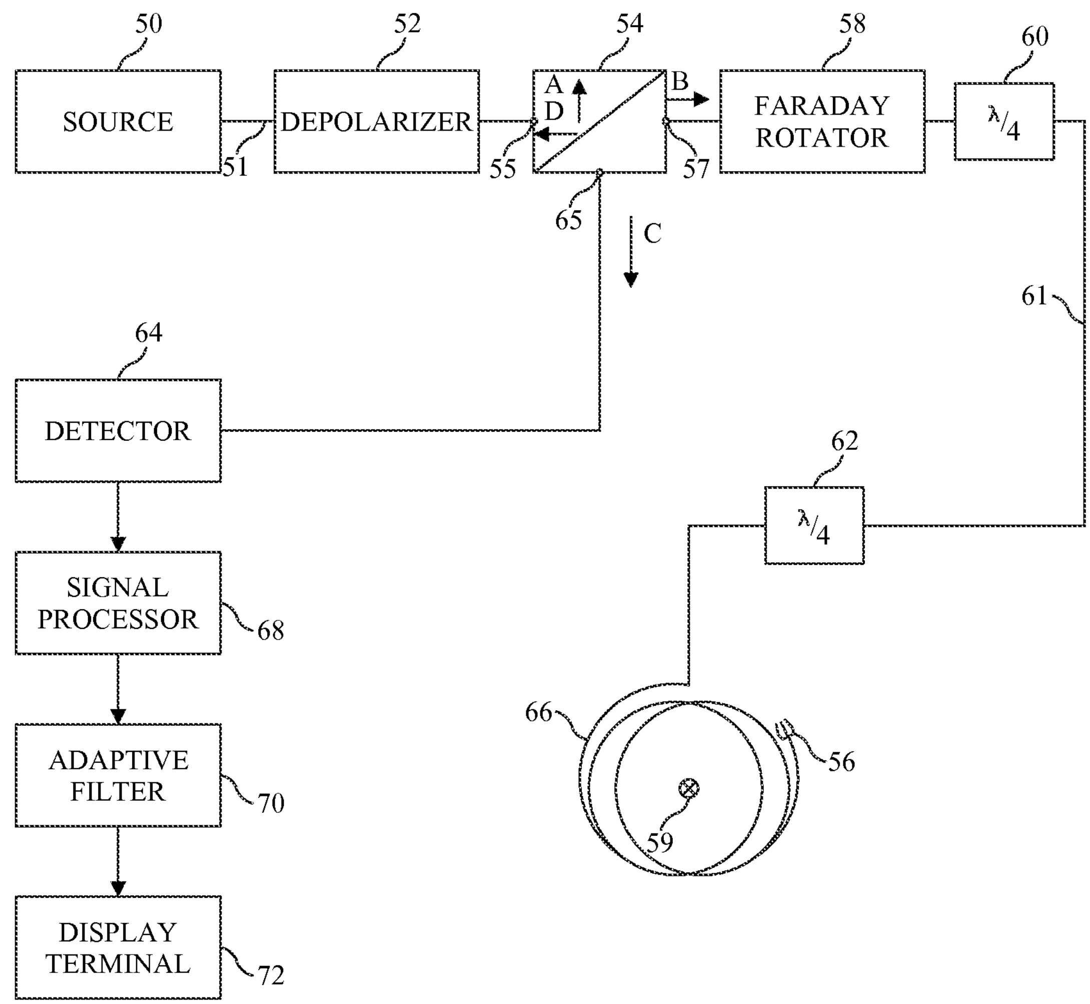
FIG. 1 depicts an optical current sensor including a filter as Background Art.

In FIG. 1, a light source 50 (e.g., a superluminescent diode (SLED)) emits light having a random polarization state which is coupled into a single mode (SM) optical fiber 51. The light is optionally depolarized by depolarizer 52 such that the polarization state of the light output from depolarizer 52 contains about one-half light having a first linear polarization state and the remainder of the light having a second linear polarization state which is orthogonal to the first linear polarization state.

The depolarized light travels on to the polarization beam splitter (PBS) 54 where it enters through port 55. The polarization beam splitter 54 operates to split the depolarized light into its two orthogonal polarization components. One polarization component (represented by arrow A) is reflected back from a splitting junction within the PBS 54 and is substantially scattered within the device (although some light could be reflected back through the port 55) and the other polarization component (represented by arrow B) is transmitted through port 57 of the PBS. Thus, in the forward propagation direction (i.e., from the source 50 to the reflective termination 56), the PBS 54 operates as a polarizer such that light having a single linear polarization state is conveyed to Faraday rotator 58.

The linearly polarized light which is incident upon the Faraday rotator 58 can be viewed as two, substantially equal, circularly polarized component waves, e.g., a right-hand circularly (RHC) polarized component wave and a left-hand circularly (LHC) polarized component wave. The Faraday rotator 58 operates to passively introduce a bias between the RHC component wave and the LHC component wave in order to improve the sensitivity of the detector to the amount of current flowing through wire 59. In this exemplary embodiment, the Faraday rotator 58 introduces a phase shift of +22.5 degrees to one of the RHC and LHC component waves and a phase shift of −22.5 degrees to the other of the RHC and LHC component waves. The biased light energy is then output to quarter-wave plate ($\lambda/4$) 60 which operates as a mode converter to convert the circularly polarized light to linearly polarized light.

The linearly polarized light is then conveyed via a polarization maintaining (PM) fiber 61 to another quarter-wave plate 62 which operates as a mode converter to convert the linearly polarized light back into circularly polarized light. The quarter-wave plate 60, PM fiber 61 and quarter-wave plate 62 are provided as a mechanism to aid in maintaining the polarization states (and more significantly the relative phase shift between the polarization components) of the light since the detector 64 operates to detect this phase shift, from which the magnitude of the current flowing through conductor 59 is determined. Depending upon the particular implementation of fiber optic current sensors according to these exemplary embodiments, the PM fiber 61 may have a length of anywhere from a meter or two to several hundred meters, over which length it is useful to maintain the polarization states of the components and the phase shift information. Linear polarization is employed in this exemplary embodiment for conveying the light over this part of the system because it is less sensitive to magnetic and stress effects which tend to degrade the purity of the polarization state of the light's component waves.

After the circularly polarized light is output from quarter-wave plate 62, it enters a sensing fiber 66 which encircles the wire 59 whose current is being monitored. The detector 64 achieves its greatest sensitivity when the circular states of polarization are well maintained throughout the sensing fiber 66. The current running through conductor 59 will introduce an additional phase shift between the RHC and LHC polarization component waves of the light passing through sensing fiber 66 according to $\Delta\Phi$=VNI, cumulatively 2VNI. The light will then reach reflective termination 56, e.g., a mirror, where it is reflected back through the sensing fiber 66 to quarter-wave plate 62. During the reverse propagation through sensing fiber 66, the RHC and LHC component waves of the light will acquire a second phase shift therebetween of 2VNI, for a total in the two passes of 4VNI. This second phase shift will be cumulative to the first phase shift (rather than offset it) because the polarization sense of the RHC and LHC component waves reverse upon incidence at the reflective termination and, on the reverse path, the light passes through the magnetic field generated by the current running through conductor 59 in the opposite direction.

The light will be converted back into linearly polarized light, by quarter-wave plate 62, for the return trip through PM fiber 61, and again back into circularly polarized light by quarter-wave plate 60. The light will be phase shifted again by Faraday rotator 58 such that the cumulative phase shift introduced between the RHC and LHC component waves is 90 degrees+4VNI. The light output from the Faraday rotator 58 then proceeds on to PBS 54. Some portion of the light output from the Faraday rotator 58 (an amount which depends upon the cumulative phase shift introduced along the forward and reverse paths) will have a polarization that causes it to be reflected from the path axis of the Faraday rotator 58 and directed out through the port 65 of the PBS 54 toward detector 64 (as represented by the arrow C in FIG. 1). The remainder of the light will be transmitted back through the port 55 of the PBS 54 toward the source 50 (as represented by the arrow D in FIG. 1) and can be isolated or dumped as desired. In this context, port 65 is the "non-reciprocal port" of PBS 54 since the light represented by arrow C is exiting the PBS 54 through a different port on its return path than the port (port 55) through which it entered the PBS 54 along the forward path. Conversely, the portion of the return light represented by arrow D exits the PBS 54 through the reciprocal port 55. Exemplary embodiments of the present invention detect the intensity of light returned through the non-reciprocal port of a polarization beam splitter.

The detector 64 generates intensity data from which the phase shift between the polarization component waves of the light returned to it via the reverse propagation path is determined. This phase shift will be related to the current passing through the conductor 59 and can, therefore, be used to output a current measurement associated therewith. For example, detector 64 can be connected to a signal processor 68 (e.g., an open-loop signal processor) for determining, e.g., a 60 Hz current associated with the detected phase shift based upon the detected intensity received from detector 64.

The output of signal processor 68 can be filtered to better preserve the shape of the current's waveform by removing noise effects from the signal processor's output and to enable the optical current sensor to better detect small currents. The resulting, filtered waveform can be output to a display terminal associated with, for example, a power quality determining instrument, a power meter or a var meter. A more detailed, exemplary filter will now be described with respect to FIG. 2.

Therein, a filter 200 removes non-harmonic noise from the output of the current sensor when the true currents are relatively small. Generally, this exemplary embodiment recognizes when the true current is small enough that noise is potentially a problem, and implements a frequency tracking comb filter 202 when this is the case. The comb filter 202 is set to pass all the harmonics of the power frequency up to some preset limit (e.g., the $100^{th}$ harmonic), but rejects all frequency components in between the harmonics. The comb filter 202 also tracks the detected power frequency to ensure that it does not lose the true high harmonics.

Figure 2:
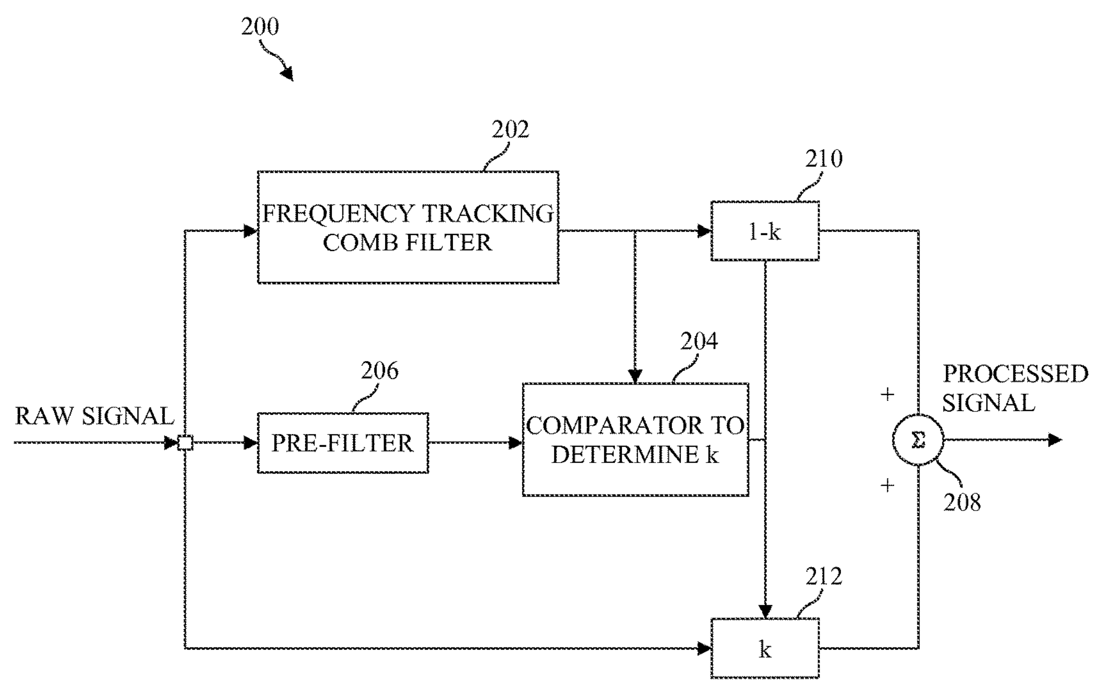
FIG. 2 shows a filter as Background Art.

More specifically, FIG. 2 shows a block diagram of the filter 200 according to an exemplary embodiment. Therein, the raw signal, e.g., the 60 Hz signal received from signal processor 68, is divided into three paths. On the uppermost signal processing path, the frequency tracking comb filter 202 receives the raw signal and continuously outputs a filtered result. The operation of an exemplary comb filter 202 is described in more detail below with respect to FIGS. 3(*a*) and 3(*b*).

In the middle signal processing path shown in FIG. 2 is a comparator 204 for determining k, which is a value which is used by the filter 200 to weight the relative contributions of the raw signal and the comb filtered signal in the final output generated by summer 208. The raw signal is, optionally, pre-filtered at block 206 using a bandpass filter to remove noise from the signal. The comparator 204 in this circuit determines both how close (in magnitude) the comb filtered signal is to the (possibly pre-filtered) raw signal and also the magnitude of the raw signal in determining a value for k. The comb filtered signal's contribution is heavily weighted (i.e., k is relatively small) by gain block 210 in the final output of the filter 200 when the magnitude of the raw signal is suitably small, and when the comb filtered signal is suitably close to the raw signal. These two conditions make it less likely that the comb filter 202 will filter transients in the measured current, and also that the comb filter 202 will not be used when it is not needed to suppress noise. Conversely, as will be discussed in more detail below, the raw signal's contribution is heavily weighted (i.e., k is relatively large) by gain block 212 when either of these two conditions are not met.

Figure 3:
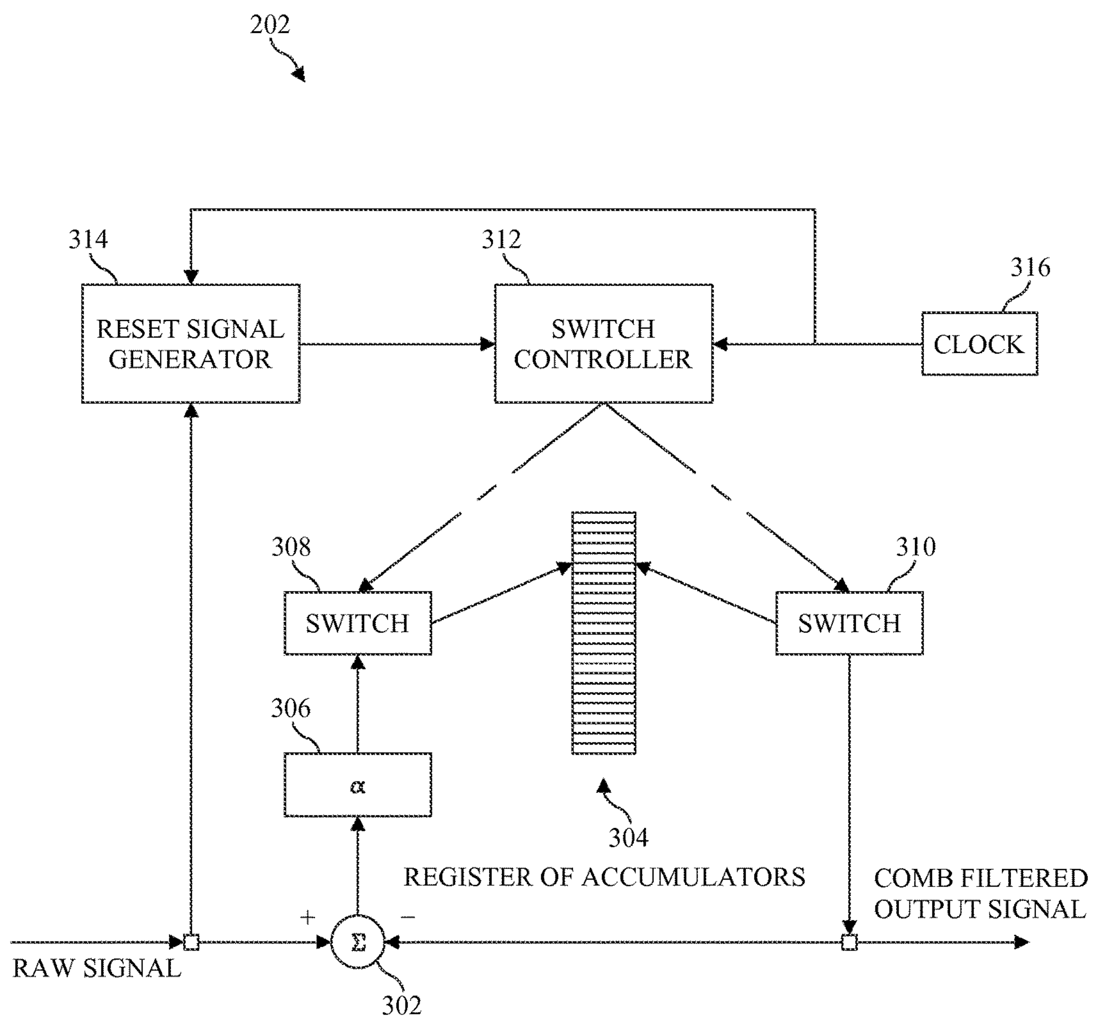
FIG. 3 shows a comb filter which can be used as part of a filtering system as Background Art.

FIG. 3 shows a block diagram of a frequency tracking comb filter 202. The comb filter 202 may be realized by passing the raw signal through a bank of successively switched low pass filters. More specifically, the raw signal is summed with a feedback signal at summer 302. This value is then multiplied by a gain factor $\alpha$ at block 306, which gain factor determines the time constant of the comb filter 202. This time constant can, for example, be set to 0.5 seconds, however it will be appreciated that other time constants, e.g., in the range of ⅛ of a second to 8 seconds, e.g., 4 seconds, may also be used depending upon the particular implementation. The resulting value is then accumulated in one of a plurality of accumulators in bank 304. For example, the 60 Hz cycle associated with the power frequency can be divided into 256 segments, each of which has an accumulator in bank 304 associated therewith. The value passed from block 306 can be added to the currently selected accumulator, e.g., selected by switch 308 under control of switch controller 312. The accumulated value of that accumulator is switched out by switch 310, also under control of the switch controller 312. The register of accumulators 304 in conjunction with the switches 308 and 310 thus operate as a series of low pass filters which effectively average waveform values over time synchronously with the fundamental frequency of the current being measured. This synchronization aspect of the comb filter 202 is handled by the reset generator 314.

Up to this point, the illustration and discussion of an optical current sensor including a comb filter with respect to FIGS. 1-3 has substantially mirrored the similar disclosure found in the above incorporated by reference U.S. Patent Publication No. 2011/0204875. However, as mentioned above, certain other applications for OCT technology may have different requirements. Consider, for example, the embodiment illustrated in FIG. 4. Therein, a system 390 includes a standby power transformer 400 which is connected (or should be connected), on the high voltage or primary side, to equipment 402. The equipment 402 can be any equipment for which it is desired to have a connected backup power supply with a monitoring system to ensure the connection, e.g., water pumps in a nuclear power plant. In this embodiment an OCT system is placed on the high voltage side of the standby power transformer 400 to perform monitoring of the current levels passing through the high side of the standby power system 400.

Figure 4:
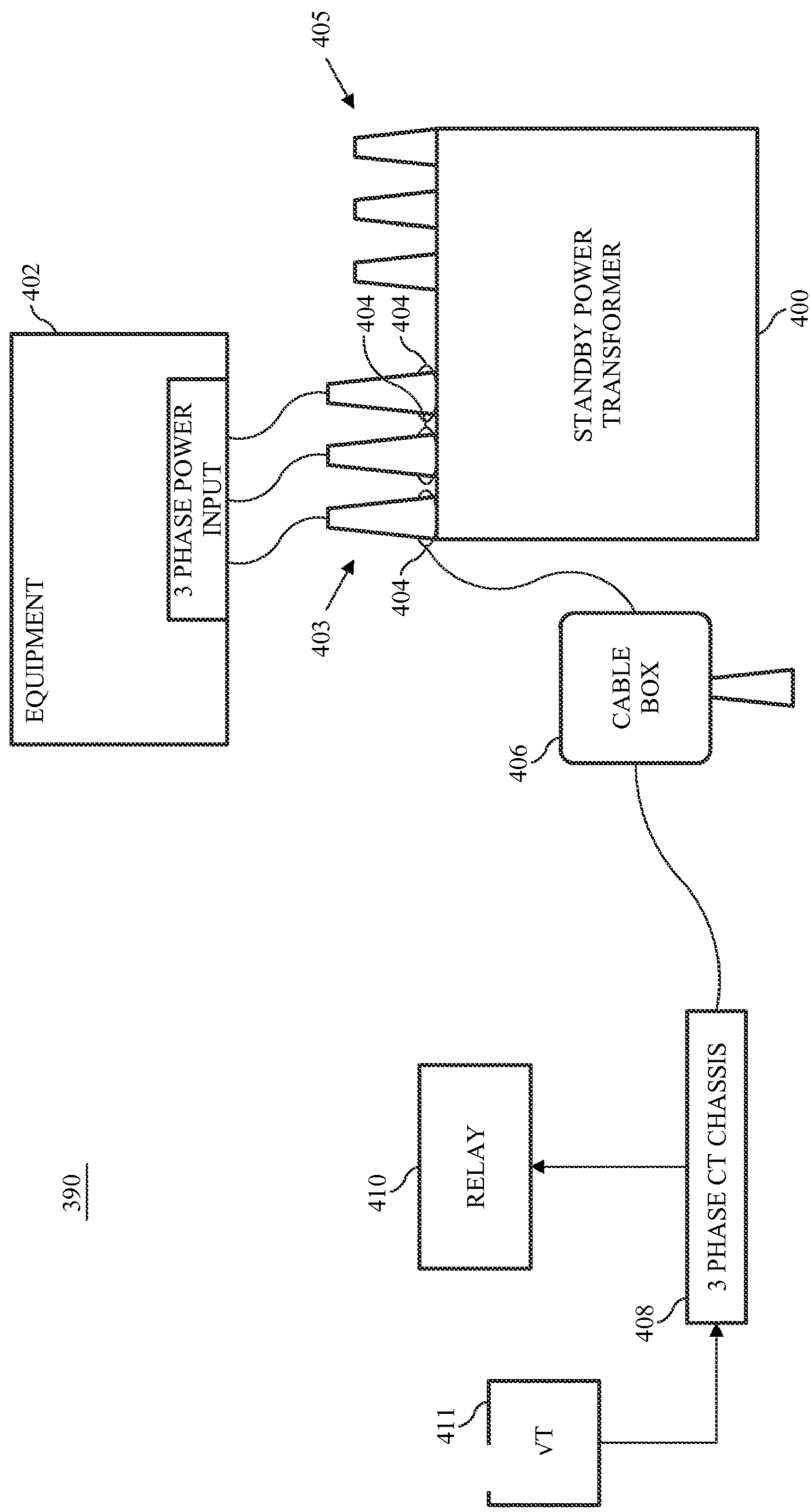
FIG. 4 illustrates a monitoring system for a standby power transformer according to an exemplary embodiment.

The OCT system can be based on the techniques described above with respect to FIGS. 1-3 (subject to a modification described below with respect to FIG. 5), can be of a free-standing design or, as shown in FIG. 4, and can be formed into rings including the sensing optical fiber which slip over the high voltage bushings of the standby power transformer 402 located on the high or primary side 403 of the standby power transformer 402. In one embodiment, one OCT can be used per bushing to measure the current flowing therethrough. Thus, three OCTs 404 are used on the 3-phase transformer 402 in the embodiment of system 390. Additionally, a fourth CT (not shown in FIG. 4) may be used to measure the neutral current. The OCT system shown in FIG. 4 also includes an unloaded (or lightly loaded) low or secondary side 405, a cable box 406, 3-phase CT chassis 408 and output device (e.g., a relay) 410 on which the measured current waveforms can be displayed for monitoring purposes. The cable box 406 can be located near by the standby power transformer 400 and can be used to manage the cables (optical fibers) which connect the rings 404 with the electronics in the 3 phase CT chassis 408. 3 phase CT chassis 408 can, for example, include filtering circuitry similar to that described above with respect to FIG. 3 and as will be described below with respect to FIGS. 5 and 7. A synchronous voltage reference can be provided by a voltage transducer (VT) 411 for use as a reference to reset the comb filter as will now be described. The VT 411 can be associated with any desired electrical power source in the power substation that can provide a healthy voltage frequency as a reference.

As mentioned above, the OCT structure illustrated in FIG. 3 may suffer from a problem in certain applications that it cannot sufficiently recover a small signal from a large noise and, for example, in applications like that illustrated in FIG. 4 such adverse conditions may exist. Thus according to an embodiment, this potential limitation is overcome by, for example, using a synchronous voltage signal as the reference for determining the exact frequency of the current to be measured instead of relying on the raw current itself to provide this reference as shown in FIG. 3. Normally, in power system applications, the voltage on the lines remains close to its nominal value while the current varies widely. Thus, a healthy voltage reference is typically always available for use as a reference in the OCT monitoring system.

Figure 5:
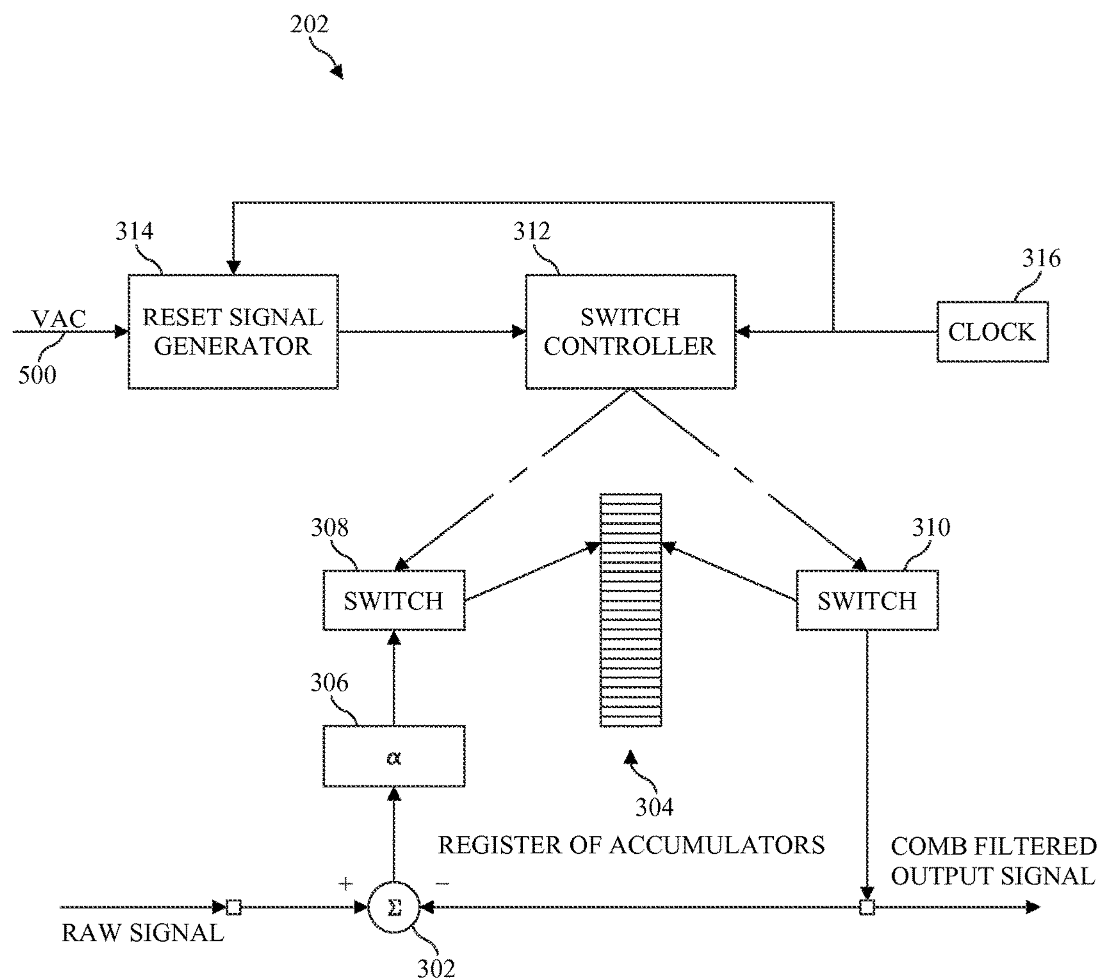
FIG. 5 depicts a comb filter which can be used within the monitoring system of FIG. 4.

For example, as shown in FIG. 5, the zero crossings of a voltage signal, e.g., an AC voltage 500 signal generated within the power transmission system, can be used to trigger the comb filter resets. For example, this voltage reference signal can be taken from a 120 V input from a voltage sensor (not shown) on the line, or simply from the wall plug. The voltage reference signal can be fed into into the chassis 408 and used to reset the comb on the zero crossings of the reference voltage signal. In FIG. 5, the remaining circuit elements are the same as those illustrated in FIG. 3 and are, therefore, not redundantly described here. {Such a scheme has been demonstrated to improve the effectiveness of the comb to recover low current signals out of a much larger noise signal by a factor of greater than 10. In this way, embodiments can eliminate the need described above for using multiple primary windings in OCT systems to achieve a measuring resolution of currents below 10 mA without resorting to, e.g., on the order of 600 wraps of sensing fiber (and thus saving substantial cost). Experiments have shown that 40 wraps of sensing fiber used in conjunction with a voltage triggered comb reset as described by these embodiments yield a system that readily measures currents below 10 mA.

Using then, the OCT structure of FIGS. 1-3, as modified to use a voltage reference to trigger the comb filter reset as discussed above with respect to FIG. 5, an application embodiment as shown in FIG. 4 can detect an open phase condition (or equivalently a grounded phase condition) of the high side (primary) of the standby power transformer 400 when the current flowing through that element is less than some preset threshold, for example (but not limited to) 25 to 200 mA, or more generally 20-500 mA, and then generate a suitable warning or indication via the relay or output device 410. The warning can be generated whenever the measured current drops below this preset threshold. Alternatively, according to one embodiment, the measured current must remain below the preset threshold for some period of time (e.g., a value within a range of 1 second-1 minute, e.g., 30 seconds) before the system alarm is alerted. This time duration can be set to be longer than the settling time of the comb filter to avoid tripping the alarm during transients.

The threshold(s) which are used to determine if the transformer is experiencing an open phase condition will likely vary from implementation to implementation. For example, in the unloaded case, some transformers may need a threshold as high as 500 mA. In loaded cases, higher thresholds may be used e.g., on the order of 1 A. The thresholds will depend on how the transformer is being used, and will be set on a case by case basis. In some situations a monitored transformer can sometimes run loaded, and sometimes unloaded. In that case, there may be two different thresholds programmed into the system, i.e., one for each condition.

According to another embodiment, some logic can be provided in the monitoring system to select one of a plurality of predetermined thresholds. For example, if all the currents coming into the transformer are below a predetermined value, the transformer is assumed to be unloaded, and therefore a lower or lowest threshold in the set of predetermined thresholds is selected and used to decide if there is an open phase. Alternatively, if one of more of the currents coming into the transformer are higher than the predetermined value, then it is assumed that the transformer is loaded, and a different (higher) current threshold is selected and used to determine when to issue a system alert.

Figure 6:
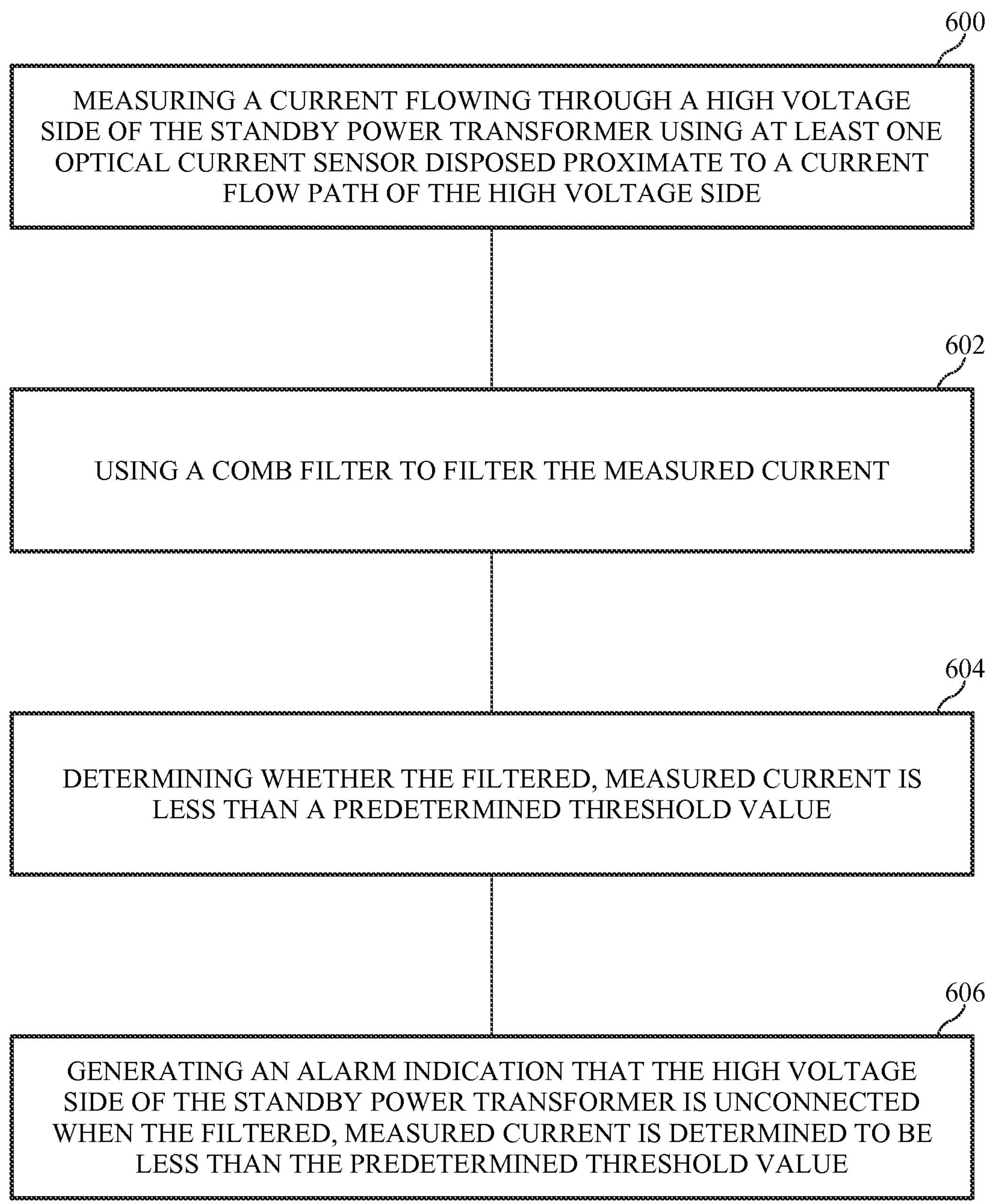
FIG. 6 shows a method flowchart for monitoring a standby power transformer according to an exemplary embodiment.

These various embodiments can, for example, also be expressed as methods, one example of which is shown in FIG. 6. Therein, at step 600, a current which flows through a high voltage side of the standby power transformer is measured using at least one optical current sensor disposed proximate to a current flow path of the high voltage side, a comb filter is used to filter the measured current at step 602, and it can then be determined whether the filtered, measured current is less than a predetermined threshold value. If so, then alarm indication that the high voltage side of the standby power transformer is unconnected is generated when the filtered, measured current is determined to be less than the predetermined threshold value.

Figure 7:
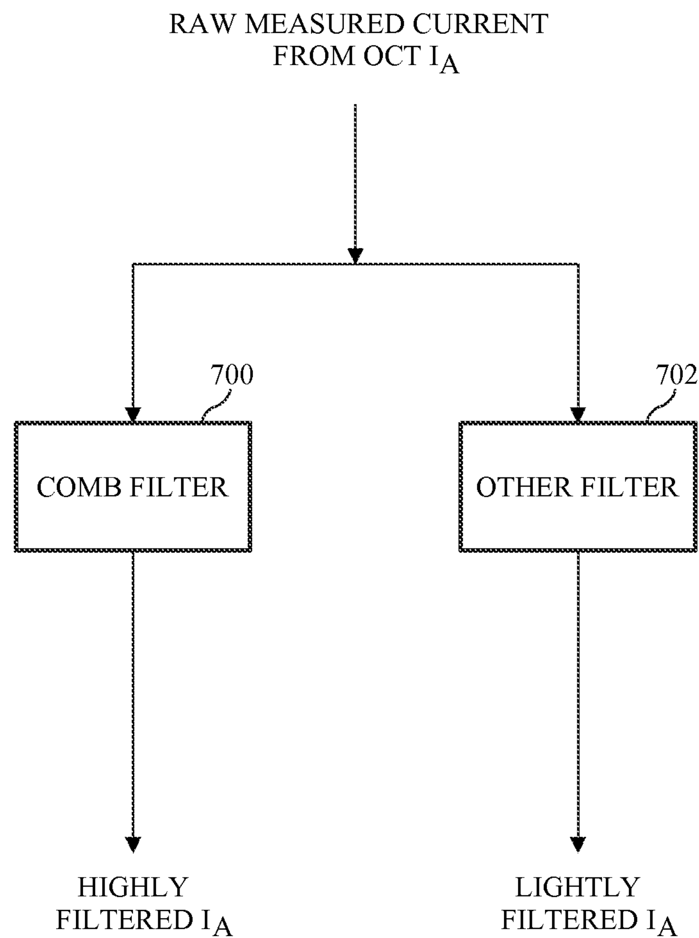
FIG. 7 depicts applying two different filtering techniques to a measured current to be used in monitoring circuitry according to an embodiment.

According to a still further embodiment, there may be other conditions used to determine when to issue a system alert in addition to the monitored current. For example, the so-called "zero sequence" of the current flowing into the transformer can be significantly affected by an open phase or a grounded phase. As will be appreciated by those skilled in the art, the zero sequence current $I_0$ is equal to the sum of (in a three phase system) the three phase currents, which is also typically equal to the neutral (physical) current. Thus according to another embodiment the logic can issue an alarm when two abnormal conditions occur, e.g., i) at least one phase current must drop below some pre-set threshold, and ii) the zero sequence current must rise above some pre-set threshold Detecting when these two conditions are met according to this embodiment may benefit from using different versions of the filtered current on which to perform logical thresholding operations. For example, as shown in FIG. 7, the raw measured current can be filtered in both a comb filter 700, e.g., as described above with respect to FIG. 5, and in another filter 702 (e.g., a bandpass or low pass filter) to generate a highly filtered output and a lightly filtered output, respectively. As will be appreciated by those skilled in the art, the lightly filtered measured current will respond more quickly to changes in the raw current than will the highly filtered measured current, and these two streams of data can be applied to logic which operates to determine whether an open phase condition exists. Although only one phase is illustrated in FIG. 7 it will be appreciated that the measured current for each phase could be processed in a similar manner.

Figure 8:
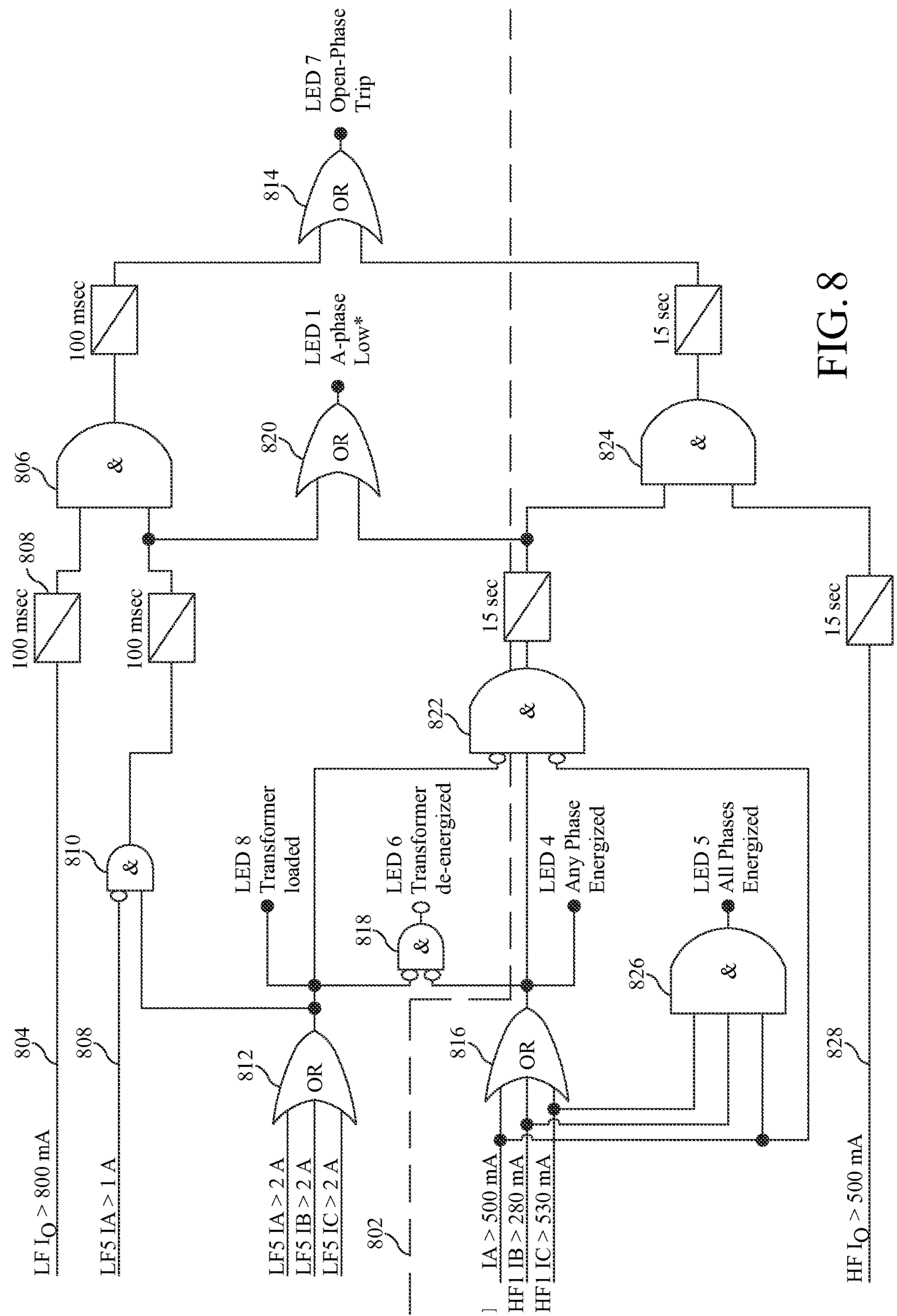
FIG. 8 illustrates alarm detection logic according to an embodiment.

A detailed, but purely illustrative, example of logic which can be used according to an embodiment to generate an alarm condition (open phase trip) using two different, filtered current measurements of both the three phases available at the standby power transformer and the zero sequence is provided as FIG. 8. Therein it can be seen that the top half of the logic circuit 800, i.e., roughly the portion above dotted line 802 has lightly filtered input current measurements, while the bottom half of the logic circuit 800 has highly filtered input current measurements. Starting with the uppermost branch 804, the lightly filtered zero sequence $I_0$ provides a positive input (e.g., a Boolean 1) to AND gate 806 if its magnitude is greater than 800 mA and a negative input (e.g., a Boolean 0) to AND gate 806 if its magnitude is less than 800 mA. Note that the numerical thresholds used in the example of FIG. 8 are purely illustrative and that other values may be used in different implementations. Also note that in some instances delay are provided, e.g., delay block 808, to ensure that the value provided on a given logic line is valid for a predetermined time, e.g., 100 msec in branch 804, to avoid false values associated with noise spikes, system transients, or the like. The remaining delay blocks shown in FIG. 8 are not further mentioned in this discussion as those skilled in the art will appreciate how such elements function and are implemented.

AND gate 806 also has, as its second input, the value which arrives via branch 808 which starts with a lightly filtered measured current $I_A$, i.e., a phase current measured by one of the OCTs 404 after having been, e.g., bandpass filtered. If this value is greater than 1 A, the value on line is positive, and otherwise the value is negative. The value on line 808 is input (inverted) to AND gate 810, which also has as its other input the output of OR gate 812. OR gate 812 has, as its input, the threshold results of a comparison between each of the three lightly filtered current measurements from the OCTs 404 associated with each of the three phases of the high side of the standby power transformer, i.e., if any one of those measured currents is greater than 2 A, then the output of OR gate 812 is positive, otherwise negative. Putting all of this together relative to the two upper branches 804 and 808, if the lightly filtered zero sequence current is greater than 800 mA for 100 msec and if both the lightly filtered single phase A current is less than 1 A and one of the three single phase A-C currents is greater than 2 A, all for at least 100 msec, then AND gate 806 will output a positive value which will activate the open-phase trip condition (alarm) via OR gate 814.

The lightly filtered inputs to OR gate 812 can also be used to drive other, optional, indicators in relay 410 via other logic in circuitry 800. For example, if any of the phases A-C show a measured current of greater than 2 A, then the positive output of OR gate 812 will also turn on LED8 in this embodiment indicating that the standby transformer is loaded. Additionally, and in conjunction with a logical contribution from highly filtered single phase A-C current measurements which are input to OR gate 816, the lightly filtered inputs also assist in determining whether to light LED 6 (indicating that the standby transformer is de-energized via AND gate 818), and assist in determining whether to light LED1 via OR gate 820, which indicates whether the A-phase is low.

Looking now to the inputs in logic circuitry 800 associated with the highly filtered current measurements, i.e., below dotted line 802, these values are all compared to their respective thresholds to generate a Boolean positive or negative value. It can be seen in FIG. 8 that these threshold values may be different from one another and may also be different from the threshold values used to generate a Boolean result relative to the lightly filtered inputs feeding OR gate 812. The threshold comparison values are all input to an OR gate 816, the output of which provides an input to AND gate 818, drives LED 4 indicating whether any of the standby transformer phases are energized and also provides one of the three inputs to AND gate 822 which in turn outputs toward OR gate 820 and OR gate 814 via AND gate 824. Additionally, the results of the threshold comparisons with their respective highly filtered current measurements are also passed to AND gate whose output is used to light LED 5 when all of the phases of the standby transformer are energized.

As mentioned earlier, in this embodiment the zero sequence current is used as part of the determination as to whether an open phase condition exists. Thus, at the bottom of FIG. 8, branch also provides a Boolean positive input when the highly filtered zero sequence current is greater than its respective threshold, in this case 500 mA, otherwise the value is negative. This value is ANDed together with the output of AND gate 822 to provide the highly filtered input to OR gate 814 which, together with the lightly filtered input to OR gate 814 from AND gate 815, provide alternative ways in which an open phase condition can be detected and an alarm generated.

Figure 9:
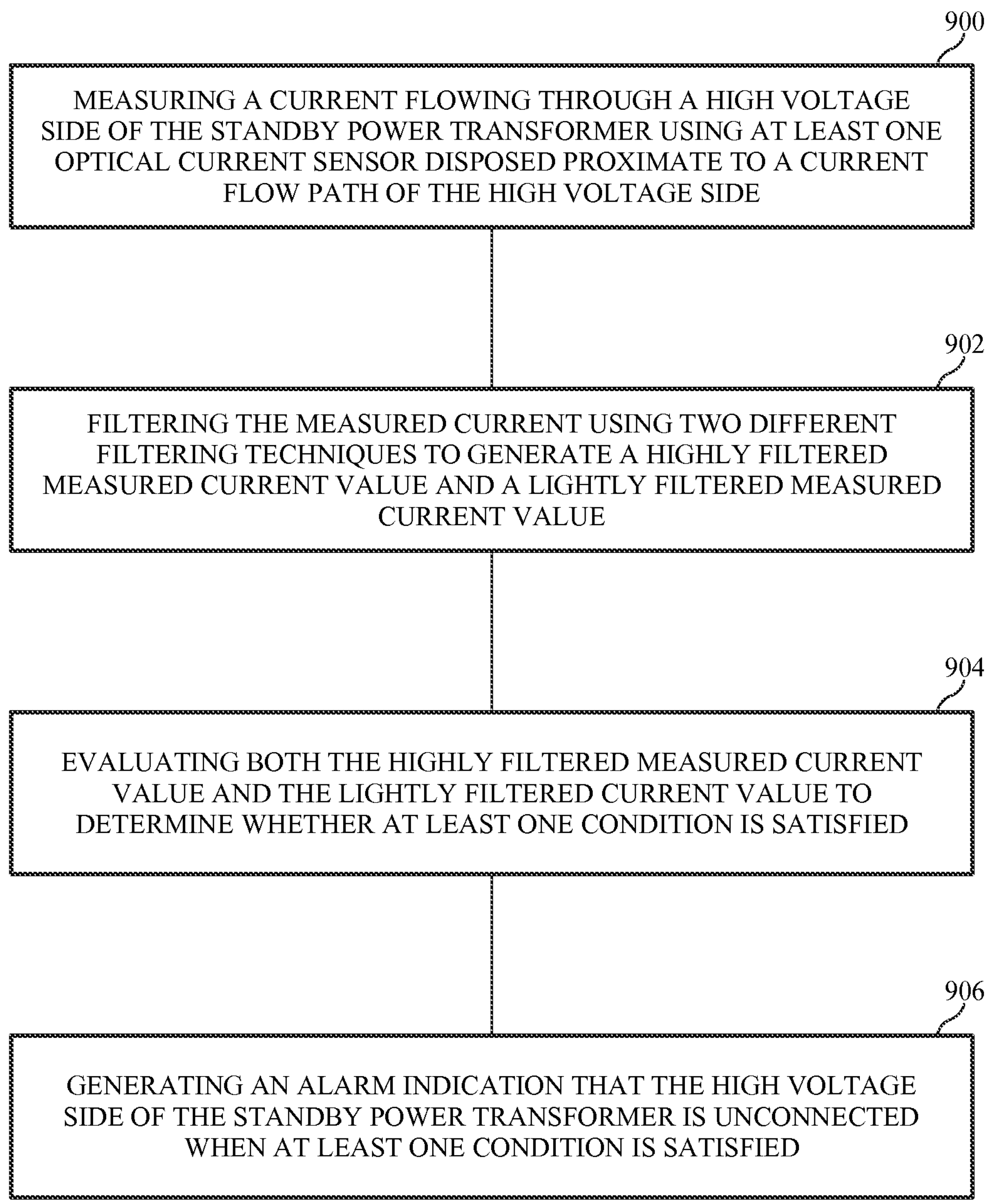
FIG. 9 is a method flowchart for monitoring a standby power transformer according to an embodiment.

From the foregoing discussion of FIGS. 7 and 8, it can be appreciated that by using the zero sequence current and by filtering the measured phase currents and zero sequence currents differently (e.g., more or less responsively to magnitude changes), a more sophisticated detection scheme can be implemented. The logic provided in FIG. 9 is purely illustrative of one such detection scheme which can be envisioned according to an embodiment. More generally, embodiments can operate in accordance with the method flow illustrated in FIG. 9. Therein, at step 900, a current flowing through a high voltage side of the standby power transformer is measured using at least one optical current sensor disposed proximate to a current flow path of the high voltage side. The measured current is then filtered using two different filtering techniques (e.g., the comb filtering technique of FIG. 5 and a bandpass filter) to generate a highly filtered measured current value and a lightly filtered measured current value at step 902. Both the highly filtered measured current value and the lightly filtered current value are evaluated, e.g., using logic such as that shown in FIG. 8, to determine whether at least one condition is satisfied at step 904. An alarm indication that the high voltage side of the standby power transformer is unconnected is generated when the at least one condition is satisfied at step 906.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A method for monitoring a connection condition of a standby power transformer, comprising:

measuring a current flowing through a high voltage side of the standby power transformer using at least one optical current sensor disposed proximate to a current flow path of the high voltage side;

using a comb filter to filter the current;

determining, by using a detection logic, whether the filtered current is less than a predetermined threshold value; and generating, by using the detection logic, an alarm indication that the high voltage side of the standby power transformer is unconnected to a power supply when the filtered current is determined to be less than the predetermined threshold value.

2. The method of claim 1, wherein the standby power transformer is unloaded on a low voltage side of the standby power transformer.

3. The method of claim 1, wherein the standby power transformer is lightly loaded on a low voltage side of the standby power transformer.

4. The method of claim 1, generating the alarm indication that the high voltage side of the standby power transformer is unconnected to the power supply when the filtered current is determined to be less than the predetermined threshold value for a predetermined time period.

5. The method of claim 1, wherein the predetermined threshold value is within a range of 20-500 mA.

6. The method of claim 4, wherein the predetermined time period is within a range of 1-10 seconds.

7. The method of claim 1, wherein the step of using the comb filter to filter the current further comprises:

using a voltage reference signal to reset the comb filter.

8. The method of claim 1, wherein said comb filter is a frequency tracking comb filter.

9. The method of claim 1, wherein said comb filter is includes a switched register of accumulators.

10. The method of claim 1, wherein the predetermined threshold value includes two values, one value for when the standby power transformer is unloaded and another value for when the standby power transformer is loaded.

11. A system for monitoring a connection condition of a standby power transformer, comprising:

a standby power transformer;

at least one optical current sensor configured to measure a current flowing through a high voltage side of the standby power transformer and disposed proximate to a current flow path of the high voltage side;

a comb filter to filter the current;

logic configured to determine whether the filtered current is less than a predetermined threshold value to generate an alarm indication that the high voltage side of the standby power transformer is unconnected to a power supply when the filtered current is determined to be less than the predetermined threshold value.

12. The system of claim 11, wherein the standby power transformer is unloaded on a low voltage side of the standby power transformer.

13. The system of claim 11, wherein the standby power transformer is lightly loaded on a low voltage side of the standby power transformer.

14. The system of claim 11, wherein the processor is further configured to generate the alarm indication that the high voltage side of the standby power transformer is unconnected to the power supply when the filtered current is determined to be less than the predetermined threshold value for a predetermined time period.

15. The system of claim 11, wherein the predetermined threshold value is within a range of 20-500 mA.

16. The system of claim 14, wherein the predetermined time period is within a range of 1-10 seconds.

17. The system of claim 11, wherein the comb filter further comprises an input of a voltage reference signal which is used to reset the comb filter.

18. The system of claim 11, wherein said comb filter is a frequency tracking comb filter.

19. The system of claim 18, wherein said comb filter includes a switched register of accumulators.

20. The system of claim 11, wherein the predetermined threshold value includes two values, one value for when the standby power transformer is unloaded and another value for when the standby power transformer is loaded.

21. A method for monitoring a connection condition of a standby power transformer, comprising:

measuring, by using an optical current sensor, a current flowing through a high voltage side of the standby power transformer using at least one optical current sensor disposed proximate to a current flow path of the high voltage side;

filtering, by using a comb filter, the measured current using two different filtering techniques to generate a highly filtered measured current value and a lightly filtered current value;

evaluating, by using a detection logic, both the highly filtered measured current value and the lightly filtered current value to determine whether at least one condition is satisfied; and generating, by using the detection logic, an alarm indication that the high voltage side of the standby power transformer is unconnected to a power supply when the at least one condition is satisfied.

22. The method of claim 21, further comprising the step of:

determining a zero sequence current associated with the measured current;

filtering the zero sequence current using the two different filtering techniques to generate a highly filtered measured zero sequence current value and a lightly filtered zero sequence current value; and using the highly filtered measured zero sequence current value and the lightly filtered zero sequence current value to determine whether the at least one condition is satisfied.

23. The method of claim 21, wherein the two different filtering techniques include a comb filtering technique and a bandpass filtering technique for generating the highly filtered measured current value and the lightly filtered measured current value, respectively.

* * * * *